(12) United States Patent
Wu et al.

(10) Patent No.: US 7,928,009 B2
(45) Date of Patent: Apr. 19, 2011

(54) METHOD FOR MAKING SEMICONDUCTOR ELECTRODES

(75) Inventors: Chih-Hung Wu, Longtan Shiang (TW); Keng-Shen Liu, Longtan Shiang (TW); Chun-Ling Chang, Longtan Shiang (TW); Ying-Ru Chen, Longtan Shiang (TW)

(73) Assignee: Atomic Energy Council-Institute of Nuclear Energy Research, Taoyuan (TW)

( * ) Notice: Subject to any disclaimer, the term of this patent is extended or adjusted under 35 U.S.C. 154(b) by 0 days.

(21) Appl. No.: 12/081,946

(22) Filed: Apr. 23, 2008

(65) Prior Publication Data
US 2010/0323515 A1 Dec. 23, 2010

(51) Int. Cl.
*H01L 21/3205* (2006.01)
(52) U.S. Cl. .................. 438/652; 438/686; 257/E21.295
(58) Field of Classification Search ............ 205/80–333; 257/210–211, 503, 508, 620, 664–665, 734–786, 257/E33.062, E33.066, E31.124, E31.125, 257/E31.126, E29.111, E29.165, E23.01, 257/E23.079, E23.141, E23.179, E21.135, 257/E21.21, E21.627, E21.641, E51.019, E21.596, E21.599; 427/436, 437; 437/230; 438/68, 113, 114, 458, 460–465, FOR. 339, FOR. 390, FOR. 386, 571, 597, 641, 650, 666, 674–678, 686
See application file for complete search history.

(56) References Cited

U.S. PATENT DOCUMENTS
2004/0065551 A1* 4/2004 Zhang ........................... 205/118
2004/0129573 A1* 7/2004 Cohen .......................... 205/170
* cited by examiner

*Primary Examiner* — Matthew Smith
*Assistant Examiner* — Walter H Swanson
(74) *Attorney, Agent, or Firm* — Jackson IPG PLLC; Demian K. Jackson

(57) ABSTRACT

A method for making semiconductor electrodes includes provided a wafer. The wafer includes at least one conductive unit, a plurality of first connective units connected to the conductive unit, a plurality of first metal layers connected to the first connective units and a plurality of second connective units connected to the first metal layers. Photo-resist is provided on the first and second connective units. A second metal layer is provided on each of the first metal layers via using an electroplating device. The wafer is cut through the photo-resist, thus forming semiconductor electrodes.

7 Claims, 9 Drawing Sheets

METHOD FOR MAKING SEMICONDUCTOR ELECTRODES

FIELD OF THE INVENTION

The present invention relates to a method for making semiconductor electrodes and, more particularly, to a simple and compatible method for making semiconductor electrodes without a high carrier concentration, with a high throughput, at a low cost.

DESCRIPTION OF THE RELATED ART

Referring to FIG. 9, there is shown a conventional semiconductor device 5. A plurality of electrode layers 51 is provided on the semiconductor device 5. Photo-resist 52 is provided on portions of the semiconductor device 5 that are not covered with the electrode layers 51. Several metal layers 53 are provided on each of the electrode layers 51. A portion of the semiconductor device 5, the related electrode layer 51 and the related metal layers 53 together form a semiconductor electrode.

Because of the current crowding effect, it is difficult to obtain uniform thickness of the metal layers 53. The semiconductor device 5 must be made with a high carrier concentration so that it exhibits good conductivity that results in even current distribution that causes uniform thickness of the metal layers 53. Therefore, the cost is high, the throughput is low and the process is complicated.

The present invention is therefore intended to obviate or at least alleviate the problems encountered in prior art.

SUMMARY OF THE INVENTION

It is the primary objective of the present invention to provide a simple and compatible method for making semiconductor electrodes without a high carrier concentration, with a high throughput, at a low cost.

To achieve the foregoing objective, the method includes the step of providing a wafer. The wafer includes at least one conductive unit, a plurality of first connective units connected to the conductive unit, a plurality of first metal layers connected to the first connective units and a plurality of second connective units connected to the first metal layers. Photo-resist is provided on the first and second connective units. A second metal layer is provided on each of the first metal layers via using an electroplating device. The wafer is cut through the photo-resist, thus forming semiconductor electrodes.

Other objectives, advantages and features of the present invention will become apparent from the following description referring to the attached drawings.

BRIEF DESCRIPTION OF THE DRAWINGS

The present invention will be described via the detailed illustration of the preferred embodiment referring to the drawings.

DESCRIPTION OF THE PREFERRED EMBODIMENT

Figure 1:
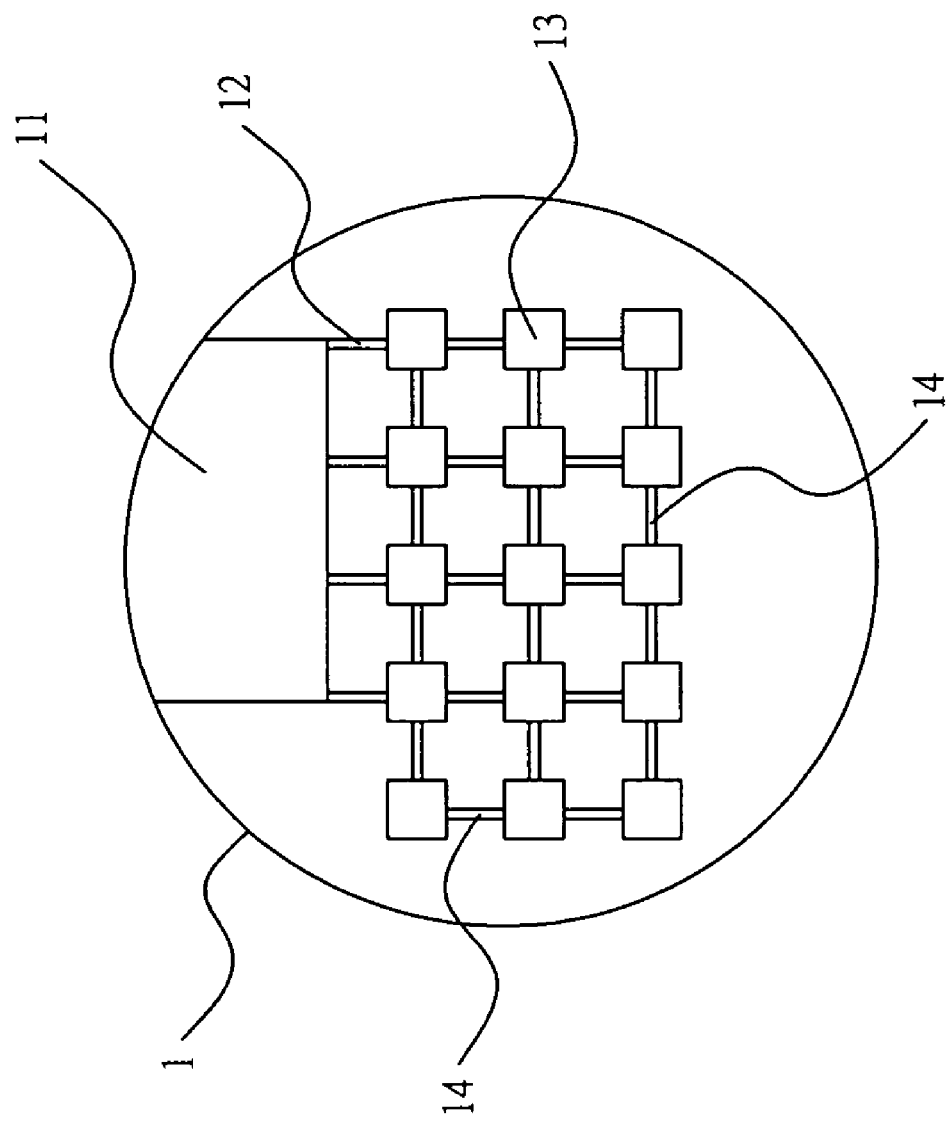
FIG. 1 is a top view of a wafer for use in a method for making semiconductor electrodes according to the preferred embodiment of the present invention.
Figure 2:
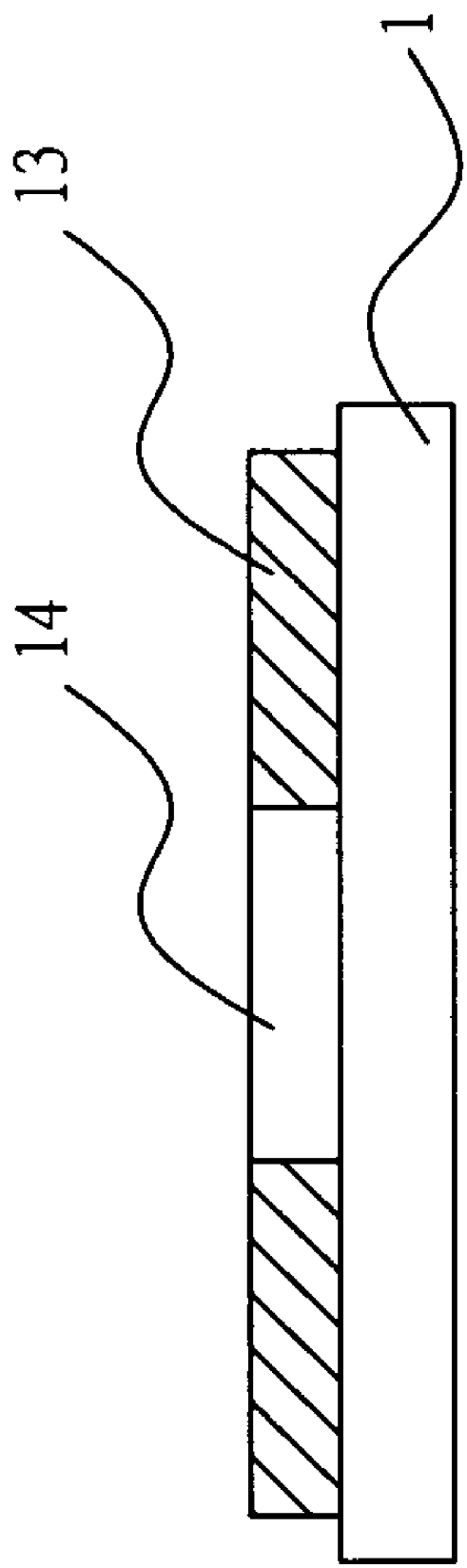
FIG. 2 is a cross-sectional view of the wafer shown in FIG. 1.

Referring to FIGS. 1 and 2, there is provided a wafer 1 for use in a method for making semiconductor electrodes according to the preferred embodiment of the present invention. The wafer 1 includes at least one conductive unit 11, a plurality of first connective units 12 connected to the conductive unit 11, a plurality of first metal layers 13 connected to the first connective units 12 and a plurality of second connective units 14 connected to the first metal layers 13. The first metal layers 13 may be made of gold-germanium alloy, gold-zinc alloy, gold-beryllium alloy or titanium-platinum-gold alloy.

Figure 3:
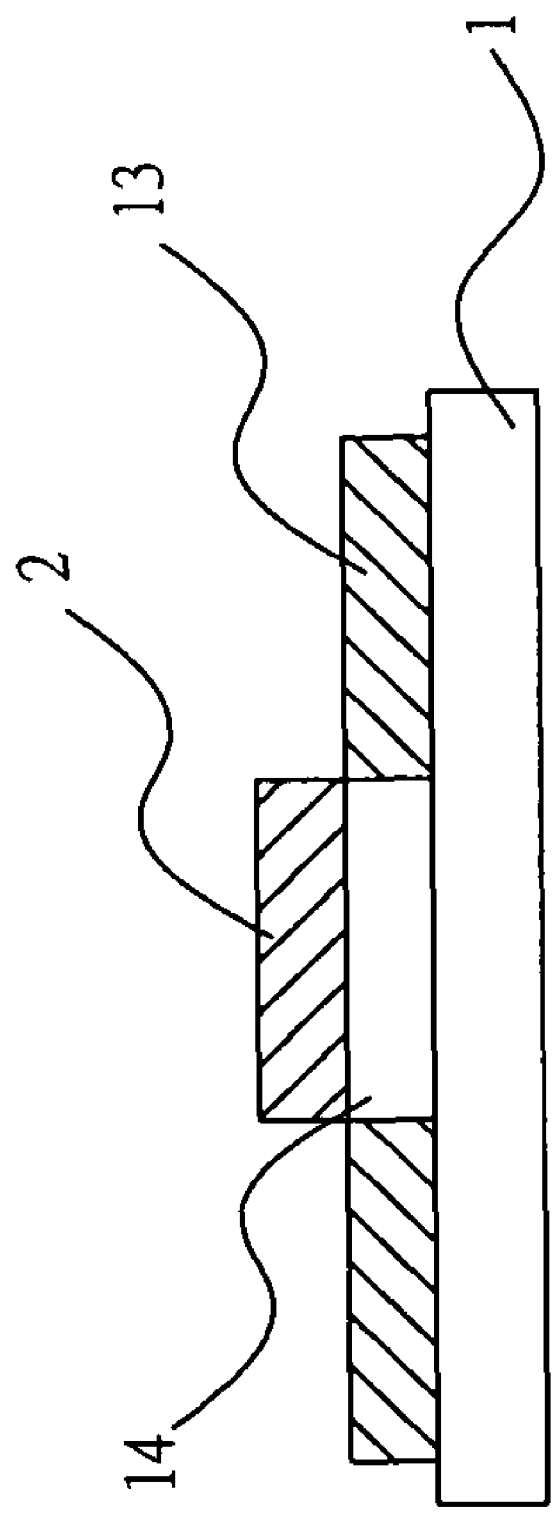
FIG. 3 is a cross-sectional view of photo-resist provided on the wafer shown in FIG. 2.

Referring to FIG. 3, photo-resist 2 is provided on the first connective units 12 and the second connective units 14 while the first metal layers 13 are not covered with the photo-resist 2.

Figure 4:
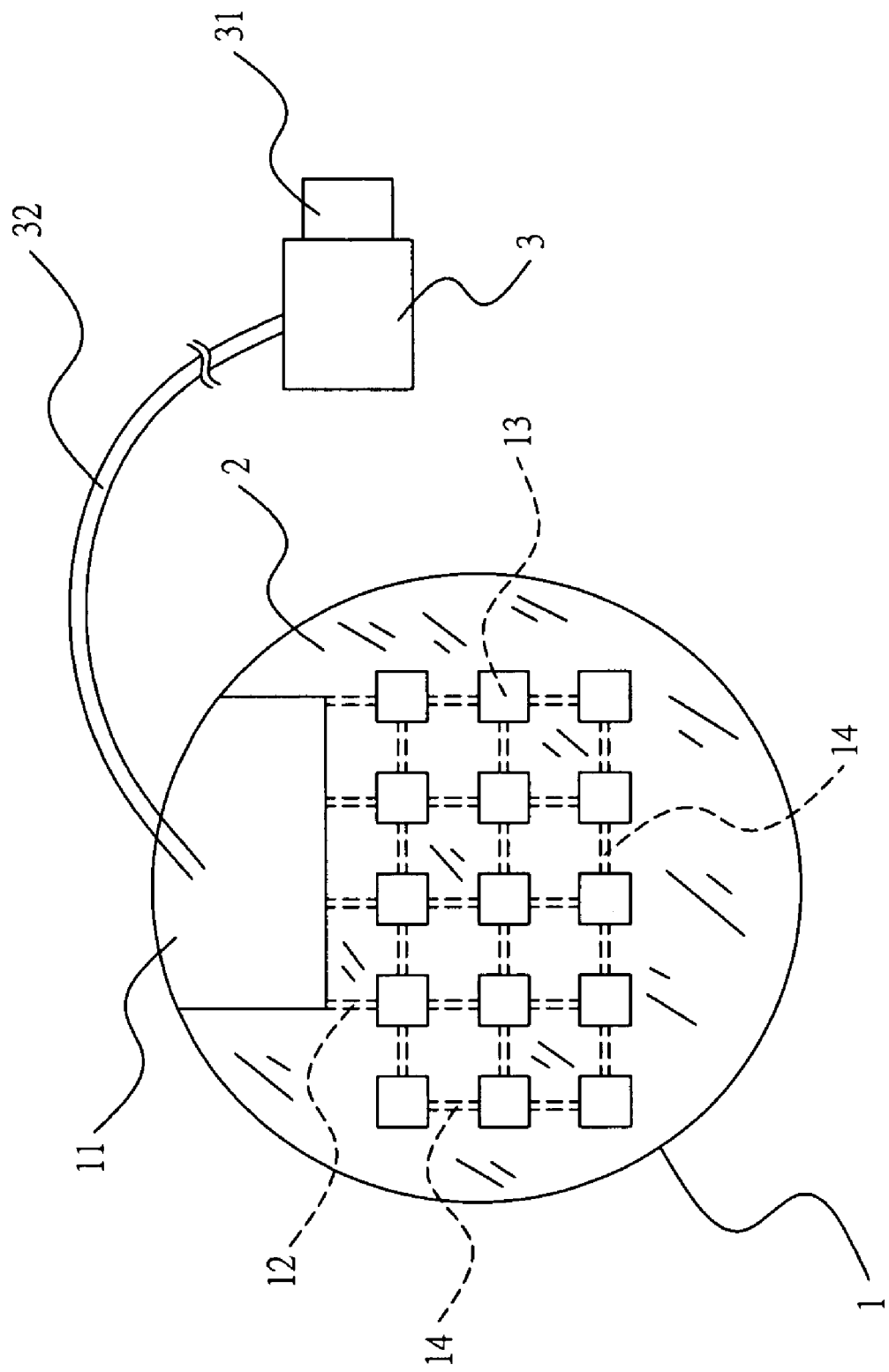
FIG. 4 is a top view of an electroplating device and the wafer shown in FIG. 3.

Referring to FIG. 4, an electroplating device 3 is connected to the conductive unit 11. Target material 331 is used in the electroplating device 3. The target material 31 is gold, silver or gold-silver alloy. An electrode 32 of the electroplating device 3 is connected to the conductive unit 11 with a wire or probe.

Figure 5:
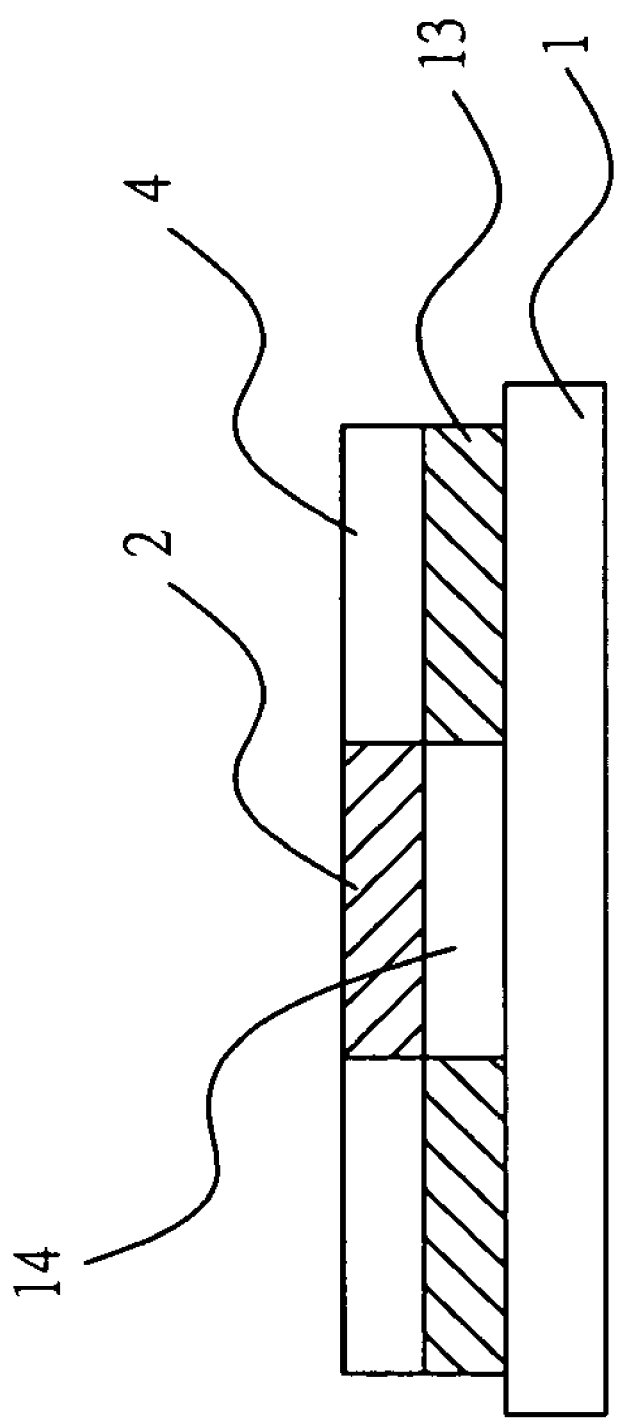
FIG. 5 is a cross-sectional view of second metal layers provided on first metal layers of the wafer shown in FIG. 3.

Referring to FIG. 5, a second metal layer 4 is provided on each of the first metal layers 13 with the electroplating device 3. The second metal layers 4 are made of gold, silver or gold-silver alloy corresponding to the target material 31.

Figure 6:
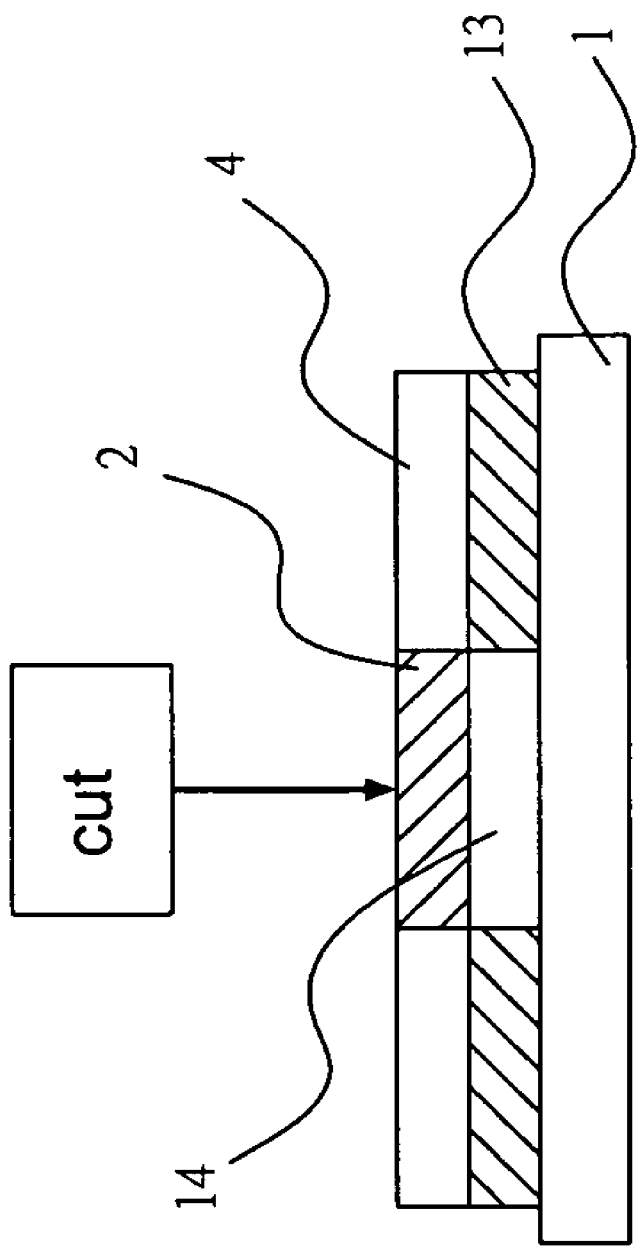
FIG. 6 is a cross-sectional view for showing a step for cutting the wafer shown in FIG. 5.
Figure 7:
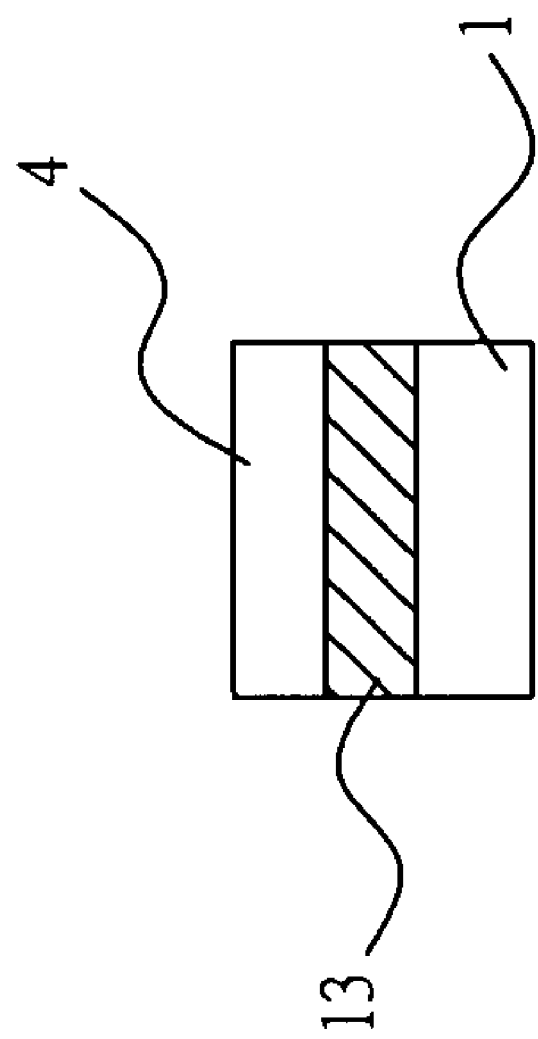
FIG. 7 is a cross-sectional view of a semiconductor electrode made in the cutting step shown in FIG. 6.

Referring to FIG. 6, a cutting step is conducted on the wafer 1. In specific, the wafer 1 is cut through the photo-resist 2. Referring to FIG. 7, a semiconductor electrode is provided in the cutting step.

The first connective units 12 and the second connective units 14 are used to ensure even current distribution so that the second metal layers 4 are made with uniform thickness. Therefore, there is no need to make the wafer 1 with a high carrier concentration.

Figure 8:
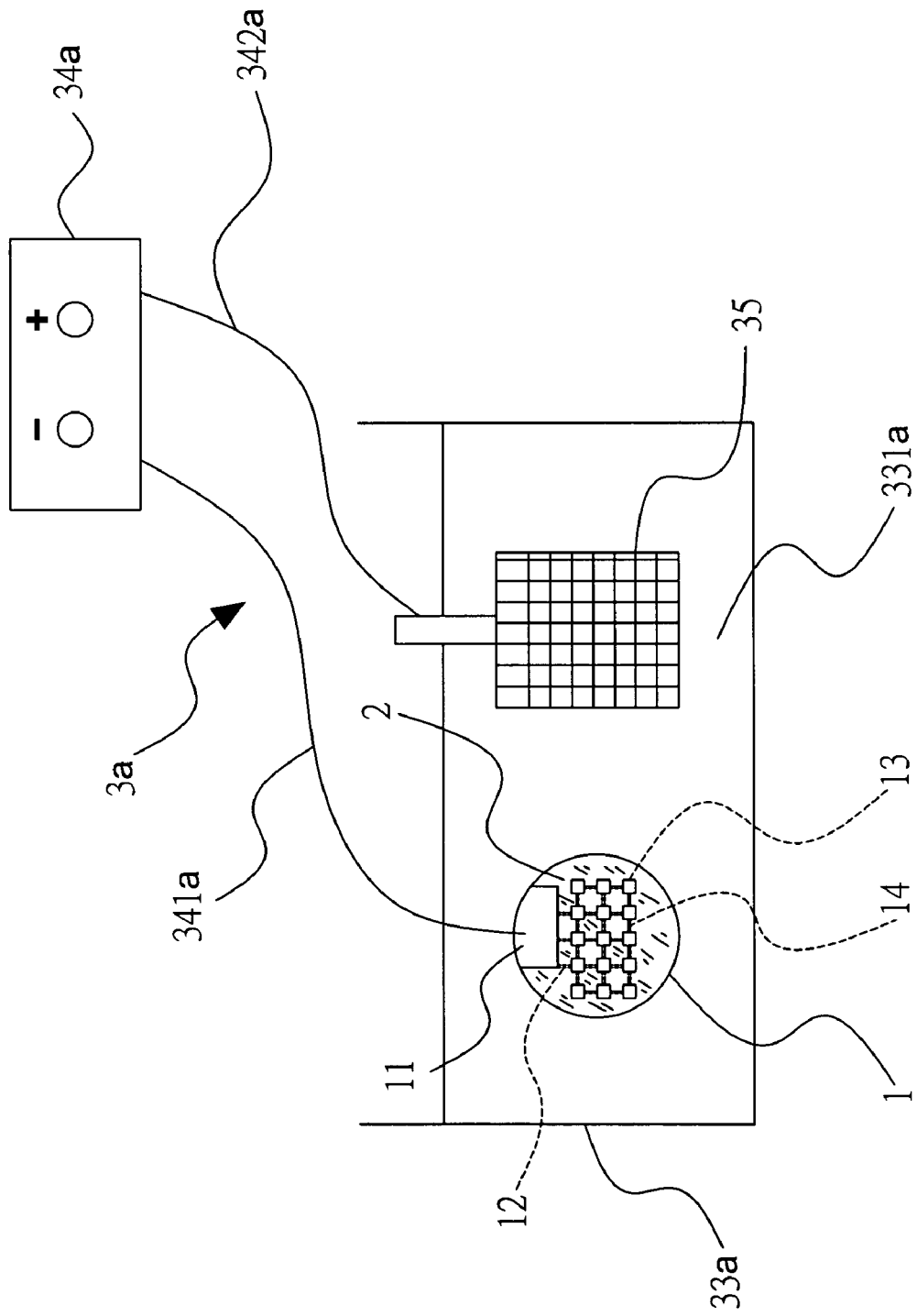
FIG. 8 is a top view of another electroplating device for use in the method according to the present invention.
Figure 9:
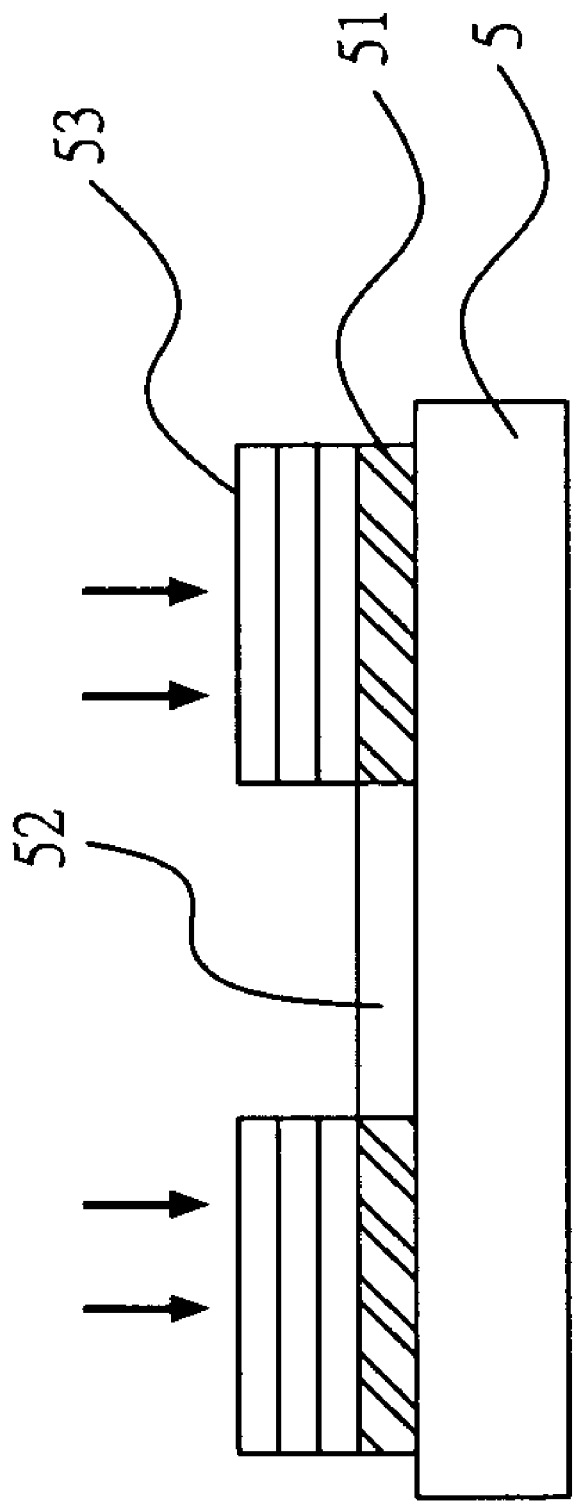
FIG. 9 is a cross-sectional view of conventional semiconductor electrodes.

Referring to FIG. 8, an electroplating device 3a can be used instead of the electroplating device 3. The electroplating device 3a includes a container 33a and a power supply 34a. The container 33a is used to contain electrolyte 331a. The electrolyte 331a includes gold, silver or gold-silver alloy. The power supply 34a includes an electrode 341a connected to the conductive unit 11 of the wafer 1 and an electrode 342a connected to a mesh 35. The mesh 35 is made of platinum alloy or titanium alloy. The wafer 1 and the mesh 35 are submerged in the electrolyte 331a.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A method for making semiconductor electrodes comprising the steps of:

providing a wafer comprising at least one conductive unit, a plurality of first connective units connected to the conductive unit, a plurality of first metal layers connected to the first connective units and a plurality of second connective units connected to the first metal layers;

providing photo-resist on the first and second connective units;

providing a second metal layer on each of the first metal layers via using an electroplating device; and cutting the wafer through the photo-resist, thus forming semiconductor electrodes.

2. The method according to claim 1, wherein the plurality of first metal layers are made of a material selected from a group consisting of gold-germanium alloy, gold-zinc alloy, gold-beryllium alloy and titanium-platinum-gold alloy.

3. The method according to claim 1, wherein the second metal layer is made of at least one material selected from a group consisting of gold and silver.

4. The method according to claim 1, wherein the electroplating device comprises target material and an electrode connected to the conductive unit.

5. The method according to claim 4, wherein the target material comprises at least one material selected from a group consisting of gold and silver.

6. The method according to claim 1, wherein the electroplating device comprises:
a container for containing electrolyte; and
a power supply comprising a first electrode connected to the conductive unit and a second electrode connected to a mesh made of a material selected from a group consisting of platinum alloy and titanium alloy.

7. The method according to claim 6, wherein the electrolyte comprises at least one material selected from a group consisting of gold and silver.

* * * * *